United States Patent [19]
Rhodes

[11] 4,060,761
[45] Nov. 29, 1977

[54] TUBULAR MAGNETIC FIELD SENSOR WITH MEANS TO RECTIFY THE SENSED SIGNAL

[75] Inventor: Melvin H. Rhodes, Cedar Rapids, Iowa

[73] Assignee: Rockwell International Corporation, El Segundo, Calif.

[21] Appl. No.: 740,915

[22] Filed: Nov. 11, 1976

[51] Int. Cl.² .................................. G01R 33/04
[52] U.S. Cl. ................................................ 324/253
[58] Field of Search .................... 324/43 R, 47, 41

[56] References Cited
U.S. PATENT DOCUMENTS

| | | | |
|---|---|---|---|
| 3,218,547 | 11/1965 | Ling | 324/43 R |
| 3,944,912 | 3/1976 | Angel et al. | 324/41 |

FOREIGN PATENT DOCUMENTS

| | | | |
|---|---|---|---|
| 611,194 | 12/1960 | Canada | 324/47 |
| 592,241 | 9/1947 | United Kingdom | 324/43 |

OTHER PUBLICATIONS

Ling; S. C., Fluxgate Magnetometer for Space Application, J. Spacecraft, vol. 1; No. 2; Mar. 1964; pp. 175–180.

Primary Examiner—Robert J. Corcoran
Attorney, Agent, or Firm—Richard A. Bachand; H. Fredrick Hamann

[57] ABSTRACT

A magnetic tube is periodically saturated in the circumferential direction such that voltages are induced, in circumferential windings, from flux along the length of the magnetic tube, produced by an external field, immediately before and immediately after each occurrence of saturation.

1 Claim, 4 Drawing Figures

TUBULAR MAGNETIC FIELD SENSOR WITH MEANS TO RECTIFY THE SENSED SIGNAL

THE INVENTION

The present invention is generally related to magnetic fields and more specifically to an improved sensor for detecting external magnetic field.

There are many types of magnetic field sensors in existence all known ones of which are solid. These primarily comprise rod sensors or pairs of rod sensors.

The present inventive concept utilizes a piece of tubular magnetic material with an excitation winding wound like a torroid with the winding going through the center of the tube and over the outside. The sense winding is then wound around the circumference of the tube. Since the two windings are wound at 90° there is no interaction between the two windings. Further, the excitation winding acts merely as a saturation device and produces flux acting in a circumferential direction. On the other hand, the external field being sensed does not affect the circumferential flux and in fact is canceled from one side to the other and thus the only detectable external magnetic field flux is in the length-wise direction of the magnetic tube. Thus, the present inventive concept is very efficient in operation and does not require extra circuitry to compensate for interference between windings.

It is therefore an object of the present invention to provide an improved magnetic sensor.

Other objects and advantages of the present invention will be apparent from a reading of the specification and appended claims in conjunction with the drawings wherein:

DETAILED DESCRIPTION

Figure 1:
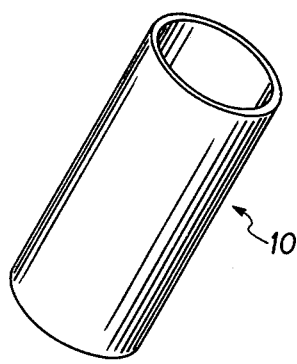
FIG. 1 is an illustration of a magnetic tube.

In FIG. 1, a tubular piece of magnetic material 10 is illustrated. This tubular material may be any type of magnetic material but for efficiency, the cross-sectional area should be small to reduce the drive signal required. Also, by making the cross-sectional area small, the eddy currents that are induced in the tube are lowered. High permeability ferrite material is one example of magnetic material which has proved satisfactory. One embodiment of the invention used a core wherein the tube had a 0.070 inch O.D. and a 0.040 inch I.D. and was 1.6 inch long. Other types of magnetic material that are usable are permalloy tubes containing approximately 80% nickel and 20% iron alloy as well as the use of a thin magnetic film deposited on a ceramic tube.

Figure 2:
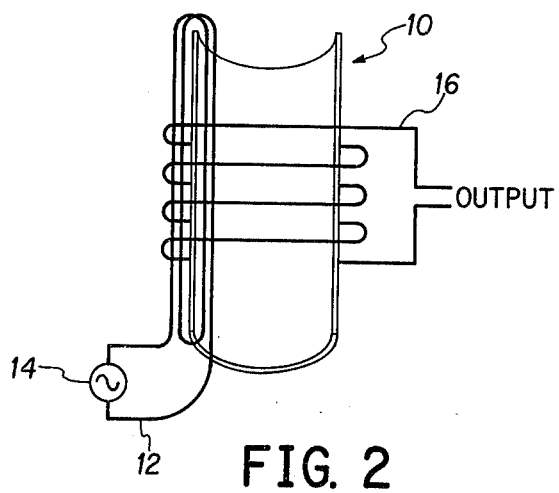
FIG. 2 illustrates in cross-sectional schematic form a magnetic tube with an excitation winding and an output winding.

In FIG. 2, a cross-section of tube 10 is illustrated with an excitation winding 12 wound from inside to outside the tube 10 and driven by an excitation generator 14. This winding 12 induces magnetic fields in the circumferential direction around the tube and these lines of flux are thus parallel with a further winding 16 which is circumferentially wound on the tube. Thus, there is no interaction between winding 16 and the excitation flux generated by winding 12. Thus, winding 16 is a sense winding for providing, as an output signal, an induced sense voltage indicative of the magnitude of external magnetic fields in the direction of the length of the tube 10.

Figure 3:
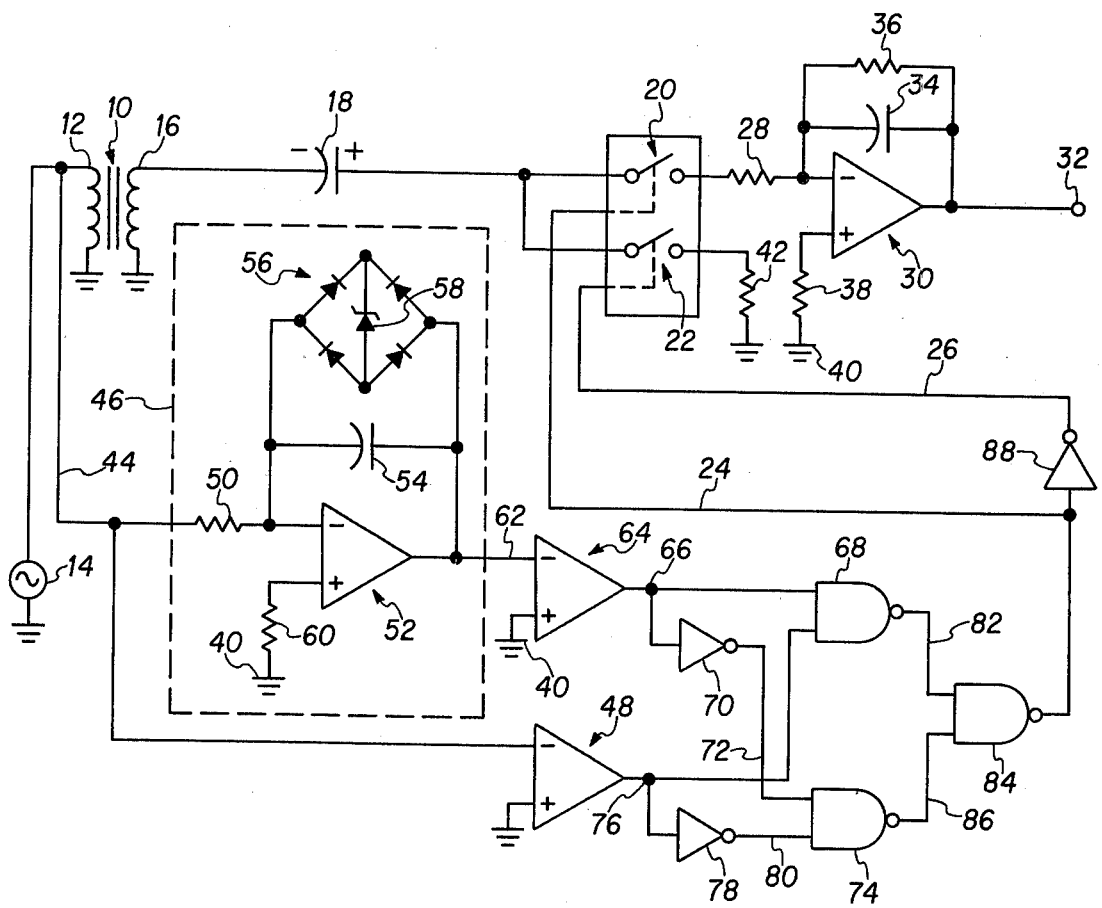
FIG. 3 is a schematic diagram showing one embodiment of a circuit for utilizing the magnetic tube of the present inventive concept.

In FIG. 3, the same designations as used in FIG. 2 are used to illustrate the same components. In addition, a capacitor 18 is connected between the output of winding 16 and the inputs to a pair of switches 20 and 22. Switches 20 and 22 are controlled by signals on leads 24 and 26, respectively. The output of switch 20 is connected through a resistor 28 to the negative or inverting input of an operational amplifier generally designated as 30 and having an output terminal 32 which provides an indication of the component of magnetic field being sensed that lies in the direction of or along the axis of the tube 10. A capacitor 34 and a resistor 36 are connected in parallel from output to input of amplifier 30 to provide filtering action. A resistor 38 is connected between ground or reference potential 40 and the positive or non-inverting input of amplifier 30. An output of switch 22 is connected through a resistor 42 to ground 40. The signals from excitation generator 14 are also supplied to a lead 44 which supplies signals to a block 46 as well as to a negative or inverting input of an operational amplifier 48. The dashed line block 46 is a volt-second integrator and contains a resistor 50 which receives signals from line 44 and applies them to a negative or inverting input of an operational amplifier 52 having a capacitor 54 connected from output to input. In addition to capacitor 54, there is a full-wave rectifying circuit 56 connected in parallel with capacitor 54 and the full-wave rectifying circuit 56 also contains a zener diode 58. A resistor 60 is connected between ground 40 and the positive or non-inverting input of amplifier 52. An output of amplifier 52 supplies output signals from the volt-second integrator 46 on a lead 62 to an inverting input of an operational amplifier 64 having an output terminal 66. Lead 66 is connected to an input of a NAND gate 68 as well as being supplied through an inverter 70 to a lead 72 which supplies signals to an input of a NAND gate 74. Each of the operational amplifiers 48 and 64 have their positive or non-inverting inputs connected to ground 40. An output of amplifier 48 is designated as 76 and is supplied to a second input of NAND gate 68 as well as being supplied through an inverter 78 to a lead 80 which supplies a second input to NAND gate 74. An output of NAND gate 68 is supplied on a lead 82 to an input of a NAND gate 84 while a second input to NAND gate 84 is supplied on a lead 86 from NAND gate 74. The output of NAND gate 84 is designated as 24 and it is inverted in an inverter 88 before being connected to control lead 26.

Figure 4:
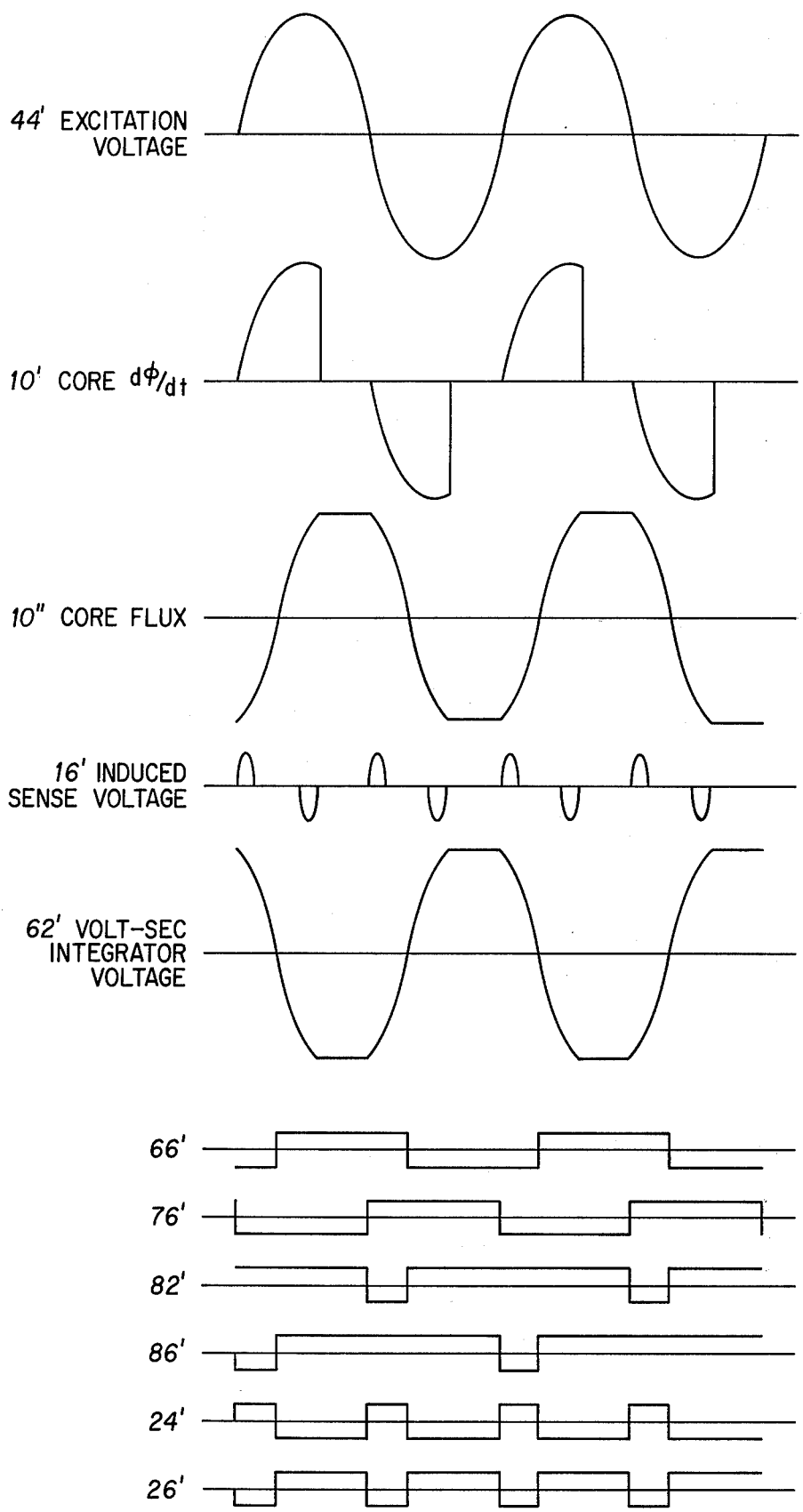
FIG. 4 comprises a plurality of waveforms used in explaining the operation in FIG. 3.

In FIG. 4, the waveforms are given similar designations with primes to those numbers used in FIG. 3. The first waveform is indicative of the excitation voltage from generator 14 on lead 44. The second one is indicative of the change in flux per unit time within core 10 and is given the designation 10'. The third waveform is indicative of the flux within core 10 and is given the designation 10". In essence, this waveform is a sine wave with the top and bottom cut off. The fourth waveform is the induced sense voltage waveform indicative of the signals obtained from winding 16. Waveform 62' is indicative of that obtained by integrating and limiting the waveform 44' in volt-second integrator 46 as the waveform appears on lead 62. The remaining waveforms are indicative of designated points within the logic circuit. It should be realized that elements 68, 70, 74, 78 and 84 may be replaced by an exclusive OR gate which will perform exactly the same function.

OPERATION

In operation, an excitation signal is supplied to the magnetic core 10 to change the flux in the core in a manner illustrated by waveform 10" and at a rate illustrated by waveform 10'. An output voltage is induced from winding 16 upon each sudden change in rate of change of flux. This induced voltage is of a magnitude proportional to the component of the external magnetic field parallel to the length of the tube 10. This induced voltage appears as waveform 16'.

The volt-second integrator 46 operates on waveform 44' in a manner to produce a signal whose waveform is identical to that of waveform 10" but opposite in polarity. This signal, in combination with the excitation voltage, is passed through inverting amplifiers 48 and 64 to produce the pulse waveforms as illustrated and thereby operate the switches 20 and 22 when the control signals appearing on lines 24 and 26 are in their respective logic 1 conditions. The switches 22 and 20 operate in a full-wave rectification manner to provide a positive output signal, from the filtering mechanism utilizing operational amplifier 30, when the external magnetic field has its strength in one direction and the opposite polarity when it is in the opposite direction. As will be noted, switch 22 is operated when waveform 26' is in a logic 1 condition. This charges capacitor 18 in a direction as shown by the positive and negative indications thereon. In the next half-cycle or when the waveform 24' is next in its logic 1 condition, a positive pulse is obtained from winding 16 thereby raising the input potential on amplifier 30 to approximately double the peak of the induced sense voltages. The following half-cycle switch 22 again closes and allows capacitor 18 to charge as indicated.

In summary, it can be determined that the inventive concept is in the use of a tubular piece of magnetic material whether it be solid or whether it be plated on a substrate using in combination a means for circumferentially inducing a magnetic field in the tube to saturate it. The induced voltage supplied by the component of an external field parallel to the length of the tube is then detected to obtain an indication of the magnitude of the magnetic field in that direction.

One circuit for obtaining such an indication utilizes a circuit for representing the core flux by using a limiting integrator and logically characterizing these signals to full-wave rectify the induced sense voltage. The characterizing is done in effectively an exclusive OR circuit which operates a pair of switches in a manner similar to that of a voltage doubling operation which in effect provides the rectification.

As will be realized, three of these sensors can be each situated perpendicular to the other two and the total information from the three sensors utilized in an XYZ computing device to determine absolute strength and direction of a magnetic field being sensed.

The present inventive concept is directed toward a magnetic field sensor and the circuit of FIG. 3 is merely illustrated for completeness of information to one skilled in the art. It should be obvious that the impedance of resistors 28 and 42 can be reduced to zero and an equivalent resistance inserted in the line between capacitor 18 and switches 20 and 22. Further, with properly constructed operational amplifiers the impedance of resistors 38 and 60 can be reduced to zero also.

While a single operative embodiment of a detection circuit for use with the magnetic sensor has been illustrated, it will be realized that many other means of detecting the field strength will be apparent to those skilled in the art and I wish to be limited only by the scope of the appended claims.

What is claimed is:

1. Magnetic sensing apparatus comprising, in combination:
   a tubular length of magnetic material;
   a first winding wound from inside to outside the tubular material;
   a second winding wound around the circumference of the tubular material;
   excitation means for applying an excitation signal to one of said windings;
   a volt second integrator means, connected to said excitation means;
   logic means, connected to the excitation means and to said volt second integrator means, for providing control signals,
   rectifier means, including control input means, connected to the other of said windings; and
   means connecting said control signals of said logic means to said control input means of said rectifier means for controlling the operation thereof to provide output sense signals indicative of magnetic field strength and direction in the vicinity of said magnetic material.

* * * * *